United States Patent
Pham et al.

(10) Patent No.: US 10,308,814 B2
(45) Date of Patent: Jun. 4, 2019

(54) COATING COMPOSITION, METHOD FOR PRODUCING SAME AND USE THEREOF

(71) Applicant: Evonik Degussa GmbH, Essen (DE)

(72) Inventors: Duy Vu Pham, Oberhausen (DE); Dennis Weber, Dortmund (DE); Felix Jaehnike, Bochum (DE)

(73) Assignee: Evonik Degussa GmbH, Essen (DE)

( * ) Notice: Subject to any disclaimer, the term of this patent is extended or adjusted under 35 U.S.C. 154(b) by 245 days.

(21) Appl. No.: 15/118,472

(22) PCT Filed: Feb. 9, 2015

(86) PCT No.: PCT/EP2015/052583
§ 371 (c)(1),
(2) Date: Aug. 11, 2016

(87) PCT Pub. No.: WO2015/121183
PCT Pub. Date: Aug. 20, 2015

(65) Prior Publication Data
US 2017/0174899 A1 Jun. 22, 2017

(30) Foreign Application Priority Data
Feb. 14, 2014 (DE) .......... 10 2014 202 718

(51) Int. Cl.
| | |
|---|---|
| C09D 1/00 | (2006.01) |
| H01L 21/02 | (2006.01) |
| H01L 29/786 | (2006.01) |
| C09D 7/20 | (2018.01) |
| C09D 5/00 | (2006.01) |
| H01L 29/24 | (2006.01) |

(52) U.S. Cl.
CPC ............ C09D 1/00 (2013.01); C09D 5/00 (2013.01); C09D 7/20 (2018.01); H01L 21/02192 (2013.01); H01L 21/02205 (2013.01); H01L 21/02282 (2013.01); H01L 21/02565 (2013.01); H01L 21/02664 (2013.01); H01L 29/24 (2013.01); H01L 29/7869 (2013.01)

(58) Field of Classification Search
None
See application file for complete search history.

(56) References Cited

U.S. PATENT DOCUMENTS

| | | | |
|---|---|---|---|
| 5,024,991 A | 6/1991 | Tsunashima et al. | |
| 5,237,081 A | 8/1993 | Moore et al. | |
| 5,645,891 A * | 7/1997 | Liu | B01D 67/0044 427/376.2 |
| 6,210,649 B1 * | 4/2001 | Ying | B01D 53/8628 423/239.1 |
| 7,569,254 B2 | 8/2009 | Rao et al. | |
| 7,585,992 B2 | 9/2009 | Leedham | |
| 8,258,501 B2 | 9/2012 | Werner et al. | |
| 8,383,286 B2 | 2/2013 | Lee et al. | |
| 8,529,802 B2 | 9/2013 | Seon et al. | |
| 8,546,594 B2 | 10/2013 | Steiger et al. | |
| 8,580,989 B2 | 11/2013 | Steiger et al. | |
| 8,647,809 B2 | 2/2014 | Sullivan et al. | |
| 8,841,164 B2 | 9/2014 | Steiger et al. | |
| 8,859,331 B2 | 10/2014 | Kim et al. | |
| 8,859,332 B2 | 10/2014 | Steiger et al. | |
| 8,889,476 B2 | 11/2014 | Thiem et al. | |
| 8,907,333 B2 | 12/2014 | Petrat et al. | |
| 8,980,976 B2 | 3/2015 | Henglein et al. | |
| 9,059,299 B2 | 6/2015 | Steiger et al. | |
| 9,115,422 B2 * | 8/2015 | Steiger | C23C 18/125 |
| 9,194,046 B2 | 11/2015 | Hoppe et al. | |
| 9,293,326 B2 | 3/2016 | Steiger et al. | |
| 9,309,595 B2 | 4/2016 | Steiger et al. | |
| 9,315,901 B2 | 4/2016 | Steiger et al. | |
| 9,650,396 B2 | 5/2017 | Steiger et al. | |
| 9,714,262 B2 * | 7/2017 | Adachi | H01L 31/02168 |
| 9,975,908 B2 | 5/2018 | Steiger et al. | |
| 2002/0140890 A1 * | 10/2002 | Hanada | G02F 1/1333 349/122 |
| 2006/0121258 A1 * | 6/2006 | Kim | C04B 35/468 428/210 |
| 2006/0132020 A1 * | 6/2006 | Kambe | C09K 11/08 313/485 |
| 2007/0184576 A1 * | 8/2007 | Chang | C23C 18/06 438/104 |

(Continued)

FOREIGN PATENT DOCUMENTS

EP 2 600 395 6/2013

OTHER PUBLICATIONS

English language translation of the International Search Report for PCT/EP2015/052583 filed Feb. 9, 2015.
English language translation of the Written Opinion of the International Searching Authority for PCT/EP2015/052583 filed Feb. 9, 2015.
English language translation of the International Preliminary Report on Patentability for PCT/EP2015/052583 filed Feb. 9, 2015.
German Search Opinion for corresponding DE 10 2014 202 718.7 dated Sep. 16, 2014 with machine translation attached.
Nomura, et al., "Highly stable amorphous In-Ga-Zn-O thin-film transistors produced by eliminating deep subgap defects," *Applied Physics Letters* 99(5):0535505-1-053505-3 (Aug. 2011).

(Continued)

*Primary Examiner* — Megan McCulley
(74) *Attorney, Agent, or Firm* — Law Office of: Michael A. Sanzo, LLC

(57) ABSTRACT

The present invention relates to a coating composition producible from at least one yttrium-containing precursor, a solvent A, and a solvent B, which is different from the solvent A, the ratio of the vapor pressure of the solvent A at 20° C. to the vapor pressure of solvent B at 20° C. being $$\frac{p_A}{p_B} \geq 10,$$

to methods for producing it, and to its use.

20 Claims, No Drawings

(56) References Cited

U.S. PATENT DOCUMENTS

| | | | |
|---|---|---|---|
| 2009/0011002 A1* | 1/2009 | Zabicky | A61K 9/127 424/450 |
| 2012/0088845 A1* | 4/2012 | Gonen Williams | B82Y 30/00 514/772.4 |
| 2012/0097957 A1 | 4/2012 | Kim et al. | |
| 2012/0104381 A1 | 5/2012 | Shieh et al. | |
| 2012/0213980 A1 | 8/2012 | Arning et al. | |
| 2013/0034708 A1* | 2/2013 | Ryu | H01L 21/67098 428/212 |
| 2013/0104773 A1 | 5/2013 | Steiger et al. | |
| 2013/0140503 A1 | 6/2013 | Hiroi et al. | |
| 2015/0076421 A1 | 3/2015 | Steiger et al. | |
| 2015/0202598 A1* | 7/2015 | Kallesoe | H01M 4/926 429/524 |
| 2016/0137671 A1 | 5/2016 | Steiger et al. | |

OTHER PUBLICATIONS

Nomura, et al., "Stability and high-frequency operation of amorphous In-Ga-Zn-O thin-film transistors with various passivation layers," *Thin Solid Films* 520(10):3778-3782 (Mar. 2012).

Tsay, et al., "Properties of transparent yttrium oxide dielectric films prepared by sol-gel process," *Ceramics International* 38(2):1677-1682 (Sep. 2011).

U.S. Appl. No. 13/809,423, filed Jan. 10, 2013, U.S. Pat. No. 2013/0104773 A1, dated May 2, 2013, Steiger, et al.

U.S. Appl. No. 14/900,890, filed Dec. 22, 2015, U.S. Pat. No. 2016/0137671 A1, dated May 19, 2016, Steiger, et al.

\* cited by examiner

COATING COMPOSITION, METHOD FOR PRODUCING SAME AND USE THEREOF

CROSS REFERENCE TO RELATED APPLICATIONS

The present application is U.S. national stage of international application PCT/EP2015/052583, which had an international filing date of Feb. 9, 2015 and which was published in German on Aug. 20, 2015. Priority is claimed to German application DE 10 2014 202 718.7, filed on Feb. 14, 2014. The contents of the priority application is hereby incorporated by reference in its entirety.

The present invention relates to a coating composition producible from at least one yttrium-containing precursor, to a method for producing it and to its use.

The production of semiconducting electronic component layers via printing and other liquid deposition processes allows production costs much lower than those of many other techniques, such as Chemical Vapour Deposition (CVD), for example, since in this case the semiconductor can be deposited in a continuous operation. Accordingly, liquid-phase processes have been developed, for example, for the production of thin-film transistors (TFTs). Thin-film transistors based on semiconductor layers containing indium oxide, in particular, are of great interest in this context. Indium oxide-containing semiconductor layers produced by way of liquid-phase processes, however, have the disadvantage of exhibiting inadequate electrical properties and inadequate stability. In particular, ambient influences and surface defects in the semiconductor layer lead to an indium oxide-containing layer whose electronic properties lack consistency over time and/or under stress. For this reason, stabilizer layers have been developed which, located over the indium oxide-containing layer, result in neutralization of surface defects and/or in protection from ambient influences.

The prior art describes yttrium oxide-containing layers as especially suitable stabilizer layers for indium oxide semiconductor layers (Nomura et al., Applied Physics Letters 99, 053505-1-053505-3 (2011); Nomura et al., Thin solid Films 520 (2012) 3378-3782; US 2012/0097957 A1). The yttrium oxide-containing layers described therein, however, are produced at great cost and complexity by way of processes such as CVD processes, E-beam evaporation and PLD (Pulsed Laser Deposition). It would therefore be desirable to be able to produce these yttrium oxide layers, which inherently are suitable for stabilizing indium oxide-containing layers, by way of less costly and inconvenient methods.

US 2012/0104381 A1 provides, for example, a general disclosure of semiconductor components based on metal oxides which have "layers of low trap density materials", which can be produced by way of liquid-phase processes or sol-gel processes, among others. Not described therein, however, are liquid-phase processes or sol-gel processes for the production of yttrium oxide-containing layers. Sol-gel processes for producing yttrium oxide-containing layers are described in, for example, the dissertation by Rudolph Rippstein (1993). Aqueous processes for producing yttrium oxide-containing layers are therefore part of the prior art. The aqueous gel solutions of yttrium precursors that are described therein, however, do not result in stabilizer layers which stabilize indium oxide-containing layers to sufficiently good effect.

It was an object of the present invention, accordingly, to provide coating compositions which are suitable in particular as stabilizer layers for indium oxide-containing layers. A particularly desirable aim in this context was to be able, using these coating compositions, to produce transistors having stabilizer layers arranged over semiconductor layers, exhibiting extremely low switch-on voltages and, furthermore, having particularly small shifts in the switch-on voltages in negative and positive bias stress tests (NBSTs and PBSTs).

The present object is achieved through the coating composition of the invention, which is producible from at least one yttrium-containing precursor, a solvent A and a solvent B, which is different from solvent A, the ratio of the vapour pressure of solvent A at 20° C. to the vapour pressure of solvent B at 20° C. being $$\frac{p_A}{p_B} \geq 10.$$

A coating composition here means a liquid formulation which is suitable for producing coatings, more particularly for producing yttrium-containing coatings. The coating composition of the invention is preferably a coating composition suitable for printing, slot-die or spin-coating processes. With very particular preference the coating composition of the invention is a coating composition suitable for printing processes, i.e. a printing ink. An yttrium-containing "precursor" here is a soluble or dispersible, yttrium-containing, chemical compound which, after a corresponding composition has been printed, can be converted into an oxidic yttrium-containing layer, more particularly an yttrium oxide layer. An "yttrium-containing" precursor here is a precursor which has at least one yttrium atom. The coating composition of the invention further comprises at least two solvents, A and B. The solvents A and B are selected such that the ratio of the vapour pressure at 20° C. for the solvent A, which is more volatile by comparison with solvent B, to the vapour pressure at 20° C. of the solvent B, which is less volatile by comparison with solvent A, is greater than or equal to 10. The vapour pressures in this case are determined using the static determination method known to the skilled person. That method measures the vapour pressure which comes about in a thermodynamic equilibrium in the closed system at a given temperature (here: 20° C.) over a substance. Here, preferably, the solvent A not only is more volatile than the solvent B, but also has the highest vapour pressure in comparison between all of the solvents present in the coating composition. Preferably, moreover, the solvent B not only is less volatile than the solvent A, but also has the lowest vapour pressure in comparison between all solvents present in the coating composition.

Determining the structure of the precursors present in solution is difficult. It is nevertheless assumed that the architecture of the precursors present in solution is the same as in the crystal. For this reason it is assumed that the formulations of the invention not only are producible from the at least one yttrium-containing precursor and the at least two solvents, but also comprise the at least one precursor and the at least two solvents. Corresponding remarks apply equally to the precursors in all of the preferred embodiments described hereinafter.

The at least one yttrium-containing precursor may have only yttrium as (semi)metal atoms. By (semi)metals are meant metals and semimetals. Alternatively, the at least one precursor, as well as yttrium, may also have other metal atoms or semimetal atoms. Preferably, however, all of the precursors used in producing the coating composition have only yttrium.

Particularly good coating compositions result if the at least one yttrium-containing precursor is selected from the group consisting of yttrium alkoxides, yttrium oxoalkoxides, yttrium alkoxyalkoxides and yttrium salts. Yttrium alkoxides are yttrium compounds having at least one yttrium atom and at least three alkoxy radicals. In contrast to yttrium alkoxides, yttrium oxoalkoxides also have at least one multiply bridging oxygen atom, meaning that they consist of at least two yttrium atoms, at least one oxo radical and at least four alkoxide radicals. On account of the bridging effect of the oxo radicals, however, yttrium oxoalkoxides are often cluster-like compounds. Yttrium alkoxyalkoxides, moreover, are yttrium compounds which have at least one yttrium atom and at least one oxoalkylalkyl radical (R—O—R'—O— radical). Yttrium alkoxyalkoxides may consist exclusively of an yttrium atom and three R—O—R'—O— radicals, or in addition to the latter may have oxo radicals and/or alkoxide radicals. Preferred yttrium salts are, furthermore, yttrium nitrates and yttrium halides. Especially good results are obtained if the at least one precursor is selected from the group of yttrium oxoalkoxides, more particularly from the group of yttrium oxoalkoxides of the generic formula $Y_xO_y(OR)_z$ where $3 \leq x \leq 12$, $1 \leq y \leq x$, $x \leq z \leq (3x-1)$ and $y+z \geq x$.

The best coating compositions comprise as their precursor the yttrium oxoalkoxide $Y_5O(O\text{-}iPr)_{13}$.

The coating compositions of the invention preferably comprise all yttrium-containing precursors used in a total fraction of 0.1 to 10 wt %, based on the total mass of the formulation.

In addition, the coating composition may also be produced using yttrium-free (semi)metal precursors. The fraction thereof is preferably not more than 5 wt %. With particular preference, however, the coating composition is produced without using yttrium-free precursors. With particular preference, therefore, the coating composition of the invention is produced with exclusively yttrium-containing precursors.

The coating composition of the invention has at least two solvents. The coating composition of the invention is preferably non-aqueous, since this allows particularly homogeneous and thin layers to be obtained. A non-aqueous coating composition here means a coating composition which does not comprise water as solvent. Corresponding coating compositions are therefore compositions which are not used in sol-gel processes. With further preference, the water content of the coating composition (as a result of absorption of water from the atmosphere, for example) is not more than 500 ppm.

The solvents A and B are preferably selected from the group of alcohols, alkoxy alcohols, hydroxy ethers and carboxylic esters, and lactic esters.

Particularly good results are obtained if the ratio of the vapour pressures of the two solvents not only is 10 or more, but also if the difference in the boiling points of the two solvents A and B under SATP conditions is $\geq 30°$ C. "SATP conditions" here means a pressure of $10^5$ Pa and a temperature of 25° C.

With further preference, the boiling point of solvent A under SATP conditions is 50 to 140° C.

Further-preferred solvents A are those selected from the group consisting of 1-methoxy-2-propanol, 2-methoxyethanol, butyl acetate, isopropanol, tert-butanol and ethanol.

Very preferably the solvent A is ethanol.

The boiling point of the solvent B is, with further preference, 100 to 200° C. under SATP conditions.

With further preference the solvent B is selected from the group consisting of 1-hexanol, cyclohexanol, tetrahydrofurfuryl alcohol, 1-methoxy-2-propyl acetate and ethyl lactate.

Very preferably the solvent B is 1-hexanol or tetrahydrofurfuryl alcohol, especially preferably tetrahydrofurfuryl alcohol.

With further preference the fraction of solvent A is 75 to 99 vol % and the fraction of solvent B is 1 to 25 wt %, based on the total volume of the solvents present.

As well as the solvents A and B, the coating composition may comprise further solvents, different from the solvents A and B. It may also have exclusively the solvents A and B, and may therefore have exclusively two solvents. The coating composition is preferably producible from at least one yttrium-containing precursor, a solvent A, and a solvent B, which is different from the solvent A, the ratio of the vapour pressure of the solvent A to the vapour pressure of the solvent B being $$\frac{p_A}{p_B} \geq 10,$$

and a further, third solvent C, which differs from the solvent A and from the solvent B. The third solvent C is preferably selected from the group consisting of 1-methoxy-2-propanol and cyclohexanol.

Especially preferred is a coating composition produced from at least one yttrium-containing precursor, a solvent A, a solvent B and a solvent C. More preferably the coating composition of the invention, therefore, has exclusively three solvents.

Very preferably the solvent A is ethanol, solvent B is 1-hexanol or tetrahydrofurfuryl alcohol, and solvent C is 1-methoxy-2-propanol or cyclohexanol.

The coating composition of the invention may additionally have one or more additives, in order to achieve desired properties. Where the coating composition includes additives, these additives are present preferably at less than 2 wt %, based on the total mass of the coating composition. With further preference, however, the coating composition of the invention is free of additives.

The present invention further provides a method for producing a coating composition according to any of the preceding claims, wherein at least one yttrium-containing precursor, a solvent A, a solvent B, which is different from the solvent A, the ratio of the vapour pressure of solvent A at 20° C. to the vapour pressure of solvent B at 20° C. being $$\frac{p_A}{p_B} \geq 10,$$

and optionally further solvents and additives, are mixed with one another.

An yttrium-containing "precursor" here is a soluble or dispersible, yttrium-containing, chemical compound which, after the printing of a corresponding composition, can be converted into an yttrium oxide-containing layer. An "yttrium-containing" precursor, moreover, means a precursor which has at least one yttrium atom. The method of the invention additionally employs at least two solvents A and B. The solvents A and B are selected such that the ratio of the vapour pressure for the solvent A, which is more volatile by comparison with solvent B, to the vapour pressure of the solvent B, which is less volatile by comparison with solvent A, is greater than or equal to 10. The vapour pressures in this case are determined using the static determination method known to the skilled person. That method measures the vapour pressure which comes about in a thermodynamic equilibrium in the closed system at a given temperature (here: 20° C.) over a substance. Here, preferably, the solvent A not only is more volatile than the solvent B, but also has the highest vapour pressure in comparison between all of the solvents used in the method. Preferably, moreover, the solvent B not only is less volatile than the solvent A, but also has the lowest vapour pressure in comparison between all solvents used in the method.

The at least one yttrium-containing precursor may have only yttrium as (semi)metal atoms. By (semi)metals are meant metals and semimetals. Alternatively, the at least one precursor, as well as yttrium, may also have other metal atoms or semimetal atoms. Preferably, however, all of the precursors used in the method have only yttrium.

Particularly good coating compositions result if the at least one yttrium-containing precursor is selected from the group consisting of yttrium alkoxides, yttrium oxoalkoxides, yttrium alkoxyalkoxides and yttrium salts. Yttrium alkoxides are yttrium compounds having at least one yttrium atom and at least three alkoxy radicals. In contrast to yttrium alkoxides, yttrium oxoalkoxides also have at least one multiply bridging oxygen atom, meaning that they consist of at least two yttrium atoms, at least one oxo radical and at least four alkoxide radicals. On account of the bridging effect of the oxo radicals, however, yttrium oxoalkoxides are often cluster-like compounds. Yttrium alkoxyalkoxides, moreover, are yttrium compounds which have at least one yttrium atom and at least one oxoalkylalkyl radical (R—O—R'—O— radical). Yttrium alkoxyalkoxides may consist exclusively of an yttrium atom and three R—O—R'—O— radicals, or in addition to the latter may have oxo radicals and/or alkoxide radicals. Preferred yttrium salts are, furthermore, yttrium nitrates and yttrium halides. Especially good results are obtained if the at least one precursor is selected from the group of yttrium oxoalkoxides, more particularly from the group of yttrium oxoalkoxides of the generic formula $Y_xO_y(OR)_z$ where $3 \leq x \leq 12$, $1 \leq y \leq x$, $x \leq z \leq (3x-1)$ and $y+z \geq x$.

The best coating compositions are obtained when the precursor is the yttrium oxoalkoxide $Y_5O(O\text{-}iPr)_{13}$.

The method of the invention preferably uses all yttrium-containing precursors in a total fraction of 0.1 to 10 wt %, based on the total mass of the formulation.

In the method of the invention, yttrium-free (semi)metal precursors may also be employed. The fraction thereof is preferably not more than 5 wt %. With particular preference, however, the method is carried out without using yttrium-free precursors. With particular preference, therefore, the coating composition of the invention is produced with exclusively yttrium-containing precursors.

The method of the invention additionally uses at least two solvents. The method of the invention is preferably non-aqueous, since in that way, for the production of particularly homogeneous and thin layers, suitable, non-aqueous coating compositions can be obtained. A non-aqueous coating composition here means a coating composition which does not comprise water as solvent. Corresponding coating compositions are therefore compositions which are not used in sol-gel processes. With further preference, the water content in the method carried out and hence also in the coating composition (as a result of absorption of water from the atmosphere, for example) is not more than 500 ppm.

The solvents A and B are preferably selected from the group of alcohols, alkoxy alcohols, hydroxy ethers and carboxylic esters, and lactic esters.

Particularly good results are obtained if the ratio of the vapour pressures of the two solvents not only is 10 or more, but also if the difference in the boiling points of the two solvents A and B under SATP conditions is 30° C. "SATP conditions" here means a pressure of $10^5$ Pa and a temperature of 25° C.

With further preference, the boiling point of solvent A under SATP conditions is 50 to 140° C.

Further-preferred solvents A are those selected from the group consisting of 1-methoxy-2-propanol, 2-methoxyethanol, butyl acetate, isopropanol, tert-butanol and ethanol.

Very preferably the solvent A is ethanol.

The boiling point of the solvent B is, with further preference, 100 to 200° C. under SATP conditions.

With further preference the solvent B is selected from the group consisting of 1-hexanol, cyclohexanol, tetrahydrofurfuryl alcohol, 1-methoxy-2-propyl acetate and ethyl lactate.

Very preferably the solvent B is 1-hexanol or tetrahydrofurfuryl alcohol, especially preferably tetrahydrofurfuryl alcohol.

With further preference the fraction of solvent A is 75 to 99 vol % and the fraction of solvent B is 1 to 25 wt %, based on the total volume of the solvents present.

In the method of the invention, as well as the solvents A and B, further solvents may be used, differing from the solvents A and B. The method may therefore employ exclusively the solvents A and B, and hence exclusively two solvents. In the method of the invention, however, preference is given to at least one yttrium-containing precursor, a solvent A, and a solvent B, which is different from the solvent A, the ratio of the vapour pressure of the solvent A at 20° C. to the vapour pressure of the solvent B at 20° C. being $$\frac{p_A}{p_B} \geq 10,$$

and at least one third solvent C, which differs from the solvent A and from the solvent B, being mixed with one another. The third solvent C is preferably selected from the group consisting of 1-methoxy-2-propanol and cyclohexanol.

Especially preferred is a method which uses at least one yttrium-containing precursor, a solvent A, a solvent B and a solvent C. In the method of the invention, therefore, with particular preference at least one yttrium-containing precursor and exactly three solvents are mixed with one another.

Very preferably the solvent A is ethanol, solvent B is 1-hexanol or tetrahydrofurfuryl alcohol, and solvent C is 1-methoxy-2-propanol or cyclohexanol.

In the method of the invention, furthermore, in order to achieve desired properties on the part of the resultant coating composition, one or more additives may be added. Where the method envisages the use of additives, they are used preferably at less than 2 wt %, based on the total mass of the components employed. With further preference, however, the method of the invention does not envisage any additives.

The invention further provides the use of the coating compositions of the invention for producing yttrium oxide-containing layers. Particularly preferred is the use of the coating compositions of the invention for producing stabilizer layers on semiconductor layers, more particularly on indium oxide-containing layers.

The invention hence also provides stabilizer layers producible from the coating compositions of the invention. Particularly good properties are achieved by the stabilizer layers of the invention if they are 1 to 20 nm thick.

Without having any restricting effect themselves, the examples which follow are intended to elucidate the subject matter of the present invention.

EXAMPLES

Example 1

A solution is formed from 25 mg of yttrium oxoalkoxide [$Y_5O(O\text{-}iPr)_{13}$] in 1 ml of tetrahydrofurfuryl alcohol by stirring. The solution is diluted with ethanol in a volume ratio of 1:3. The solution is applied by spin-coating to an indium oxide-containing layer. The yttrium-containing coating present on the indium oxide-containing layer is converted thermally.

Example 2

A solution is formed from 25 mg of yttrium oxoalkoxide [$Y_5O(O\text{-}iPr)_{13}$] in 1 ml of 1-methoxy-2-propanol by stirring. The solution is diluted with 2 parts of 1-methoxy-2-propanol, with 1 part of ethanol and with 0.2 part of tetrahydrofurfuryl alcohol. The solution is applied by spin-coating to an indium oxide-containing layer. The yttrium-containing coating present on the indium oxide-containing layer is converted thermally.

Example 3

A solution is formed from 25 mg of yttrium oxoalkoxide [$Y_5O(O\text{-}iPr)_{13}$] in 1 ml of tetrahydrofurfuryl alcohol by stirring. The solution is diluted with 1.33 parts of cyclohexanol and with 1.67 parts of tert-butanol. The solution is applied by spin-coating to an indium oxide-containing layer. The yttrium-containing coating present on the indium oxide-containing layer is converted thermally.

Comparative Example 1

A solution is formed from 25 mg of yttrium oxoalkoxide [$Y_5O(O\text{-}iPr)_{13}$] in 1 ml of tetrahydrofurfuryl alcohol by stirring. The solution is diluted with tetrahydrofurfuryl alcohol in a volume ratio of 1:3. The solution is applied by spin-coating to an indium oxide-containing layer. The yttrium-containing coating present on the indium oxide-containing layer is converted thermally.

Comparative Example 2

A solution is formed from 25 mg of yttrium oxoalkoxide [$Y_5O(O\text{-}iPr)_{13}$] in 1 ml of 1-methoxy-2-propanol by stirring. The solution is diluted with 1-methoxy-2-propanol in a volume ratio of 1:3. The solution is applied by spin-coating to an indium oxide-containing layer. The yttrium-containing coating present on the indium oxide-containing layer is converted thermally.

Comparative Example 3

A solution is formed from 25 mg of yttrium oxoalkoxide [$Y_5O(O\text{-}iPr)_{13}$] in 1 ml of 1-methoxy-2-propanol by stirring. The solution is diluted with ethanol in a volume ratio of 1:3. The solution is applied to an indium oxide-containing layer. The yttrium-containing coating present on the indium oxide-containing layer is converted thermally.

The following is the case for all examples: Layer production is carried out by spin-coating of 100 µl at 2000 rpm for 60 seconds. Substrates coated are silicon wafers (1.5×1.5 cm$^2$) with a 230 nm $SiO_2$ layer and pre-patterned source and drain contacts made from ITO. These wafers have been coated beforehand with 100 µl of an indium alkoxide-containing coating composition by spin coating at 2000 rpm for 30 seconds, and this layer has been converted thermally into an indium oxide-containing layer. The thermal conversion of both layers takes place on a hotplate.

Electrical characterization is carried out using a Keithley 2612 System source meter and Keithley 3706-NFP System switch/multimeter. The samples are measured at RT under an N2 atmosphere. Characterization takes place following the temperature treatment. The (pre-patterned) gate, source and drain contacts here are connected to the apparatus (tungsten measurement tips). A voltage profile is run between gate electrode and source electrode (−20 to +30 V), and the current which flows between source electrode and drain electrode is recorded. This data can be used to calculate the mobility values. The formulae used for this are as follows:

$$\mu_{lin} = \frac{\partial I_D}{\partial V_G} \frac{L}{WC_iV_D}$$

$$\mu_{sat} = \frac{2L}{WC_i}\left(\frac{\partial(\sqrt{I_D})}{\partial V_G}\right)^2$$

where $I_D$ and $V_G$ are the current between drain and source and the voltage applied at the gate, respectively. L and W correspond to the length and width of the channel, and $C_i$ is the dielectric constant of the dielectric. The higher the mobility value, the better the material.

Further characteristic properties are the switch-on voltage ($V_{On}$), which describes the point at which current flow between source electrode and drain electrode begins; this value ought to be very close to 0 V.

Also relevant is the shift in the switch-on voltage between a measurement before and after a negative or positive bias stress test (NBST or PBST). In this case, after recording of the initial characteristic line for 2000 seconds, a gate voltage ($V_G$) of −20 V (NBST) or +20 V (PBST) is applied. In both cases, a drain voltage ($V_D$) of +5 V is applied. After this time, a further characteristic line is recorded, and a determination is made of the shift of the switch-on voltage in comparison to the initial characteristic line. The amount of this value ought to be as low as possible. In the assessment it is important to note that for practicable application, both the switch-on voltage and the shift after an NBST or PBST ought as far as possible to be zero.

| Solvents used | Vol % of the solvents | µ [cm$^2$/Vs] | NBST $V_{On}$ [V] | $\Delta V_{On}$ | PBST $V_{On}$ [V] | $\Delta V_{On}$ |
|---|---|---|---|---|---|---|
| Inventive examples | | | | | | |
| Tetrahydrofurfuryl alcohol, | 25% | 4.4 | −0.5 | −1 | −1 | 2.5 |
| ethanol | 75% | | | | | |

-continued

| Solvents used | Vol % of the solvents | μ [cm²/Vs] | NBST V$_{On}$ [V] | NBST ΔV$_{On}$ | PBST V$_{On}$ [V] | PBST ΔV$_{On}$ |
|---|---|---|---|---|---|---|
| Tetrahydrofurfuryl alcohol, 1-methoxy-2-propanol, ethanol | 4.5% 71.5% 24% | 5.5 | −1 | −0.5 | −1.5 | 1 |
| Tetrahydrofurfuryl alcohol, cyclohexanol tert-butanol | 25% 33.25% 41.75% | 3.1 | −2 | −1.5 | −2.5 | 3 |
| Comparative examples | | | | | | |
| Tetrahydrofurfuryl alcohol | 100% | 3.3 | −16.5 | 1.5 | −18.5 | 0 |
| 1-Methoxy-2-propanol | 100% | 2.6 | −2.5 | −15 | −13.5 | 10.5 |
| 1-Methoxy-2-propanol, ethanol | 25% 75% | 3.1 | −3 | −14.5 | −14 | 14 |

The invention claimed is:

1. A coating composition that can be produced by mixing: a) at least one yttrium-containing precursor; b) a solvent A; and c) a solvent B, which is different from solvent A, wherein the ratio of the vapour pressure of solvent A at 20° C. to the vapour pressure of solvent B at 20° C. is:

$$\frac{p_A}{p_B} \geq 10$$

and wherein:
a) the at least one yttrium-containing precursor comprises a yttrium oxoalkoxide;
b) the coating composition does not comprise water as a solvent; and
c) the only metal or semimetal present in precursors is yttrium.

2. The coating composition of claim 1, wherein the at least one yttrium-containing precursor is further comprises one or more compounds selected from the group consisting of: yttrium alkoxides; yttrium alkoxyalkoxides; and yttrium salts.

3. The coating composition of claim 1, wherein the water content in the coating composition (including water absorbed from the atmosphere) is not more than 500 ppm and the coating composition is free of additives.

4. The coating composition of claim 1, wherein the at least one yttrium-containing precursor is Y$_5$O(O-iPr)$_{13}$.

5. The coating composition of claim 1, wherein the fraction of all yttrium-containing precursors used is 0.1 to 10 wt %, based on the total mass of the formulation.

6. The coating composition of claim 1, wherein the solvents are selected from the group consisting of: alcohols; alkoxy alcohols; hydroxy ethers; carboxylic esters and lactic esters.

7. The coating composition of claim 1, wherein the difference in the boiling points of the two solvents A and B under SATP conditions is ≥30° C.

8. The coating composition of claim 1, wherein the boiling point of solvent A under SATP conditions is 50 to 140° C.

9. The coating composition of claim 8, wherein solvent A is selected from the group consisting of: 1-methoxy-2-propanol; 2-methoxyethanol; butyl acetate; isopropanol; tert-butanol; and ethanol.

10. The coating composition of claim 1, wherein the boiling point of solvent B under SATP conditions is 100 to 200° C.

11. The coating composition of claim 10, wherein solvent B is selected from the group consisting of: 1-hexanol; cyclohexanol; tetrahydrofurfuryl alcohol; 1-methoxy-2-propyl acetate; and ethyl lactate.

12. The coating composition of claim 1, wherein the fraction of solvent A is 75 to 99 vol % and the fraction of solvent B is 1 to 25 wt %, based on the total volume of solvents present.

13. The coating composition of claim 1, wherein, in addition to A and B, said composition comprises one or more additional solvents.

14. A composition comprising a layer of the coating composition of claim 1, wherein said coating composition coats a layer of semiconductor.

15. The composition of claim 14, wherein said layer of semiconductor comprises indium oxide.

16. A method for producing a coating composition comprising, mixing at least one yttrium-containing precursor, a solvent A, and a solvent B, which is different from the solvent A, wherein the ratio of the vapour pressure of solvent A at 20° C. to the vapour pressure of solvent B at 20° C. is $$\frac{p_A}{p_B} \geq 10$$

and wherein:
a) the at least one yttrium-containing precursor comprises a yttrium oxoalkoxide;
b) the coating composition does not comprise water as a solvent; and
c) the only metal or semimetal present in precursors is yttrium.

17. The method of claim 16, wherein further solvents or additives are mixed with said at least one yttrium-containing precursor, a solvent A, and a solvent B.

18. The method of claim 16, wherein the at least one yttrium-containing precursor is further comprises one or more compounds selected from the group consisting of: yttrium alkoxides; yttrium alkoxyalkoxides; and yttrium salts.

19. The method of claim 16, wherein the water content in the coating composition (including water absorbed from the atmosphere) is not more than 500 ppm and the coating composition is free of additives.

20. The method of claim 16, wherein the at least one yttrium-containing precursor is Y$_5$O(O-tPr)$_{13}$.

* * * * *